US011201079B2

(12) United States Patent
Liao et al.

(10) Patent No.: US 11,201,079 B2
(45) Date of Patent: Dec. 14, 2021

(54) WAFER CHUCK

(71) Applicant: Taiwan Semiconductor Manufacturing Co., Ltd., Hsinchu (TW)

(72) Inventors: Sih-Hao Liao, New Taipei (TW); Chen-Hua Yu, Hsinchu (TW); Hung-Jui Kuo, Hsinchu (TW); Yu-Hsiang Hu, Hsinchu (TW); Wei-Chih Chen, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 454 days.

(21) Appl. No.: 15/992,209

(22) Filed: May 30, 2018

(65) Prior Publication Data

US 2019/0371646 A1 Dec. 5, 2019

(51) Int. Cl.
*H01L 21/683* (2006.01)
*B25B 11/00* (2006.01)
*H01L 21/687* (2006.01)

(52) U.S. Cl.
CPC ........ *H01L 21/6838* (2013.01); *B25B 11/005* (2013.01); *H01L 21/68785* (2013.01)

(58) Field of Classification Search
CPC .............. H01L 21/683; H01L 21/6838; H01L 21/68714; H01L 21/68735; H01L 21/6875; B23Q 3/088; B25B 11/005
See application file for complete search history.

(56) References Cited

U.S. PATENT DOCUMENTS

| | | | | |
|---|---|---|---|---|
| 6,540,899 B2* | 4/2003 | Keigler | .................. | C25D 17/06 204/224 R |
| 2002/0043337 A1* | 4/2002 | Goodman | ......... | H01L 21/68728 156/345.12 |
| 2010/0013169 A1 | 1/2010 | Monteen et al. | | |
| 2013/0156947 A1 | 6/2013 | Tseng et al. | | |
| 2014/0182788 A1* | 7/2014 | Falster | .................. | H01L 21/302 156/443 |
| 2018/0193983 A1* | 7/2018 | Ishino | .................. | B25B 11/005 |

FOREIGN PATENT DOCUMENTS

| | | | | |
|---|---|---|---|---|
| CN | 103531511 | | 1/2014 | |
| JP | 2004228453 | | 8/2004 | |
| JP | 2019145827 A | * | 8/2019 | ........... H01L 21/683 |

(Continued)

OTHER PUBLICATIONS

STIC translation of TWM453955U1 (Year: 2012).*

(Continued)

*Primary Examiner* — Tyrone V Hall, Jr.
*Assistant Examiner* — Abbie E Quann
(74) *Attorney, Agent, or Firm* — JCIPRNET

(57) ABSTRACT

A wafer chuck includes a chuck body and a plurality of seal rings. The chuck body includes a carrying surface configured to receive a wafer and at least one vacuum hole disposed on the carrying surface. A ratio of a diameter of the carrying surface to a diameter of the wafer is substantially equal to greater than 45% and substantially equal to or smaller than 90%. The seal rings are disposed on the carrying surface and configured to physically contact with the wafer. The seal rings surround the vacuum hole.

20 Claims, 8 Drawing Sheets

(56) References Cited

FOREIGN PATENT DOCUMENTS

| | | |
|---|---|---|
| TW | 200401390 | 1/2004 |
| TW | M453955 U1 * | 12/2012 |
| TW | M453955 | 5/2013 |
| TW | 201423901 | 6/2014 |
| TW | 201735149 | 10/2017 |

OTHER PUBLICATIONS

JP2019145827 translation (Year: 2019).*
"Office Action of Taiwan Counterpart Application," dated May 13, 2019, p. 1-p. 7.
"Office Action of Taiwan Counterpart Application," dated Jul. 22, 2019, p. 1-p. 12.

* cited by examiner

WAFER CHUCK

BACKGROUND

Larger wafers hold more chips and can reduce per-chip cost. Accordingly, wafers having large sizes are now commonly used in semiconductor manufacturing processes. Although the wafers having large sizes, such as 300 mm or even larger, can be used to reduce manufacturing cost, larger wafers introduce new issues that were not previously considered in smaller wafers. One critical issue is the wafer warpage which has become more severe with 300 mm or larger wafers.

Wafer warpage causes many undesired manufacturing defects. For example, a spun-on layer on the wafer may have a larger thickness at the center than the outer edge. In an etching process, critical dimension (CD) uniformity problem from wafer center to edge at least partly comes from imperfect chucking over wafer warpage. Moreover, in a photolithographic process, a photoresist (PR) layer's thickness uniformity from wafer centre to outer edge is critical. During exposure, wafer warpage induced focus drift can be disastrous for CD uniformity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
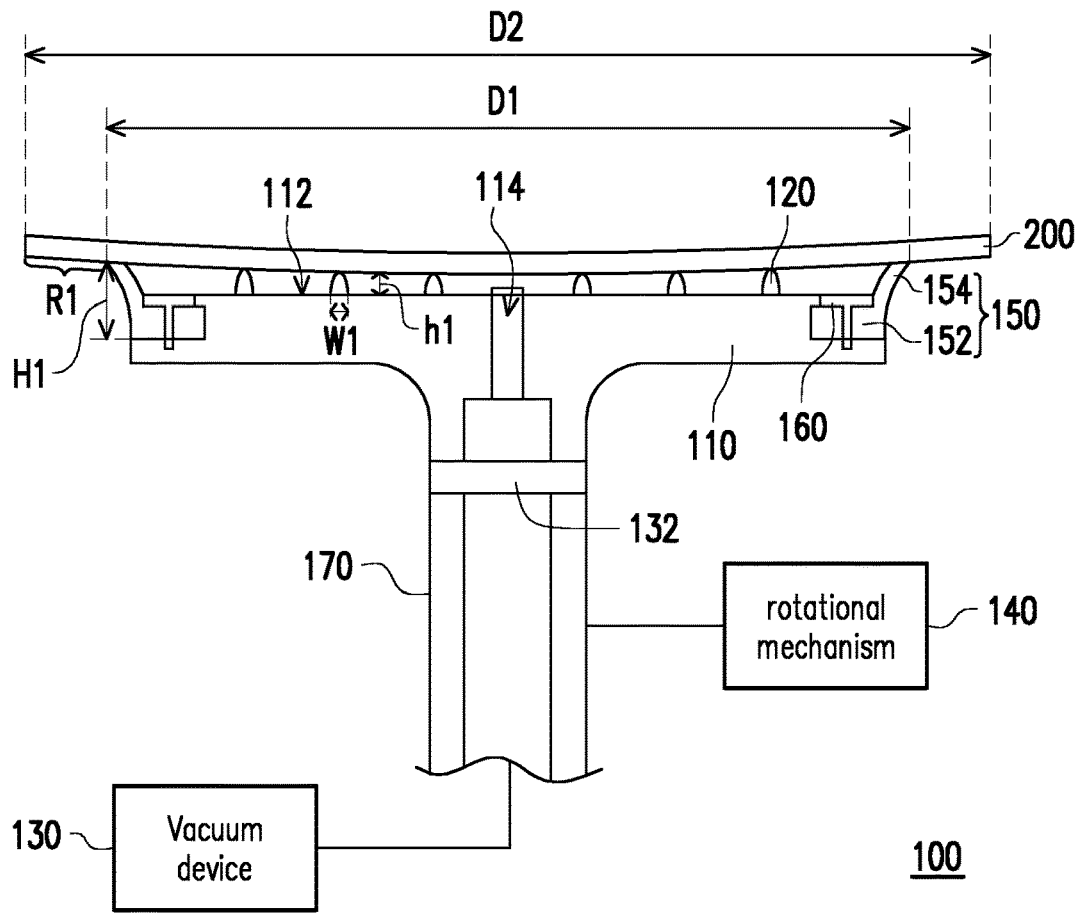
FIG. 1 illustrates a cross sectional view of a wafer chuck according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Figure 2:
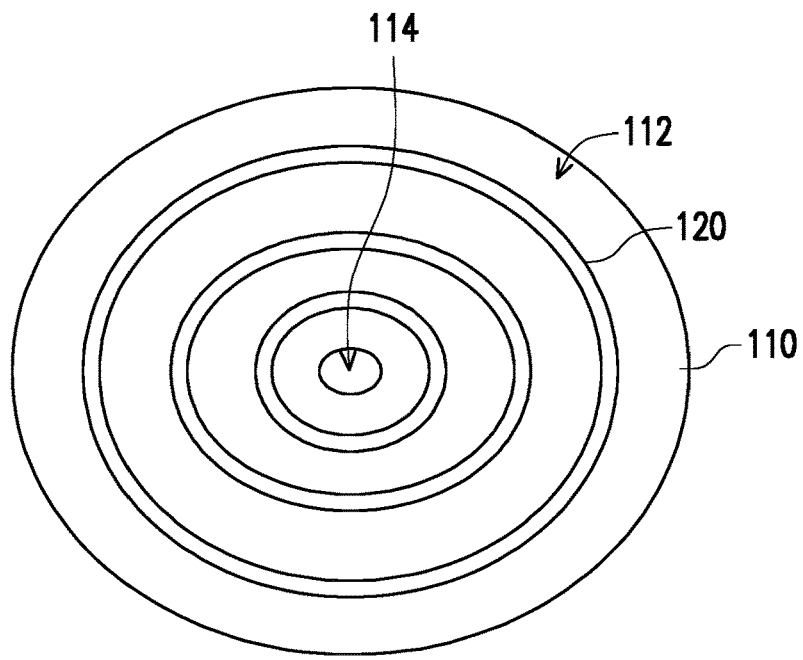
FIG. 2 illustrates a top view of a wafer chuck according to some exemplary embodiments of the present disclosure.

FIG. 1 illustrates a cross sectional view of a wafer chuck according to some exemplary embodiments of the present disclosure. FIG. 2 illustrates a top view of a wafer chuck according to some exemplary embodiments of the present disclosure. In some embodiments, a wafer chuck is configured to support a wafer and retain the wafer in a fixed position in order to uniformly process the wafer in a semiconductor wafer processing process. For example, Referring to FIG. 1, in some embodiments, the wafer chuck 100 includes a chuck body 110, a plurality of seal rings 120 in engagement with the chuck body 110, and a vacuum device 130 coupled to the chuck body 110. In some embodiments, widths of the seal rings 120 may be different from one another. The chuck body 110 includes a carrying surface 112 configured to receive the wafer 200 and at least one vacuum hole 114 disposed on the carrying surface 112.

In some embodiments, the wafer chuck 100 is configured to hold and position the wafer 200 during processing of the wafer in a wafer fabrication process such as in a processing chamber of a CVD apparatus for forming a thin film on a semiconductor wafer, in a dry etching apparatus for micromachining the wafer, or for holding a glass substrate wafer for liquid crystal display or for carrier during semiconductor packaging process, or the like. In some embodiments, the carrying surface 112 is circular having a diameter D1 less than a diameter D2 of the wafer 200 to prevent protruding portions such as the seal rings 120 on the carrying surface 111 from extending beyond a peripheral edge R1 of the wafer 200 and from being exposed to etching reaction products. Moreover, with the arrangement of the carrying surface 112 not extending beyond the peripheral edge R1 also allows a backside rinse process to be performed on the peripheral edge R1 of the wafer 200 to rinse off unwanted chemicals and/or particles on the back surface of the wafer 200. In some embodiments, the width of the peripheral edge R1 is about 20 mm. In some embodiments, a diameter of a rinse platform for performing the backside rinse process may be about 290 mm, and the diameter D2 of the wafer 200 may be greater than or substantially equal to 300 mm. Accordingly, a ratio of a diameter D1 of the carrying surface 112 to a diameter D2 of the wafer 200 is designed to be substantially equal to greater than 45% and substantially equal to or smaller than 90%, such that the vacuum force and the supporting force provided by the wafer chuck 100 can be distributed more evenly. As such, when the vacuum is applied, warpage profile of the wafer 200 can be well adjusted since the contact area between the wafer 200 and the wafer chuck 100 is increased. For example, in some embodiments, the diameter D1 of the carrying surface 112 is designed to be substantially greater than 130 mm, such as being substantially equal to or smaller than 260 mm, so as to keep clearance (e.g. peripheral edge R1) for backside rinse and preventing the wafer chuck 100 from being exposed to chemicals such as etching reaction products. For example, the diameter D1 of the carrying surface 112 may range between 140 mm and 260 mm. In the present embodiment, the diameter D1 of the carrying surface 112 is substantially 260 mm.

In some embodiments, a vacuum device 130 is coupled to the chuck body 110 and in gas communication with the vacuum holes 114. For example, the vacuum device 130 may be a vacuum pump, and may be configured to apply vacuum to the backside of the wafer 200 to hold the wafer 200 in place. In some embodiments, the seal rings 120 are disposed on the carrying surface 112 and configured to physically contact with the wafer 200. The seal rings 120 surround the vacuum hole 114. In some implementations, the seal rings 120 are protruded from the carrying surface. Accordingly, when the wafer 200 is placed on the carrying surface 112, the tips of the seal rings 120 physically contact with the back surface of the wafer 200 to allow the wafer 200 to reside thereon, and to form a seal between the chuck body 110 and the backside of the wafer 200 when vacuum is applied. Referring to the embodiment shown in FIG. 2, the seal rings 120 are arranged in a concentric manner and surround the single vacuum hole 114 at the center of the chuck body 110, but the disclosure does not limit the number of the vacuum hole 114 and the arrangement of the seal rings 120.

In some embodiments, the height h1 of each of the seal rings 120 is substantially higher than the height of each of the vacuum holes 114. Therefore, when the vacuum is applied by the vacuum device 130 through the vacuum holes 114, the wafer 200 would lean against the seal rings 120 and a vacuum condition is created between the chuck body 110 and the wafer 200

In some embodiments, the chuck body 110 is supported by a shaft 170. The wafer chuck 100 may further include a rotational mechanism 140 configured to rotate/spin the chuck body 110 and the shaft 170 around an axis of shaft 170 extending normal to the center of the carrying surface 112. The shaft 170 may be coupled to the rotational mechanism 140 such as a spindle motor, or the like. Accordingly, the chuck body 110 and the shaft 170 are spun by the rotational mechanism 140. In some embodiments, the shaft 170 is hollow, thereby permitting passage of gas, such as air, through the vacuum hole 114, so as to create a vacuum condition between the chuck body 110 and the wafer 200 by the vacuum device 130. In some embodiments, the wafer chuck further includes a gas valve 132 disposed within the shaft 170 to control the vacuum performance (e.g. on and off, strong or weak, etc.) of the vacuum device 130. The purpose of the vacuum device 130 is to provide a securing arrangement for the wafer 200 in addition to the chuck body 110. In some embodiments, the anticipated size of the wafer 200 is greater than or substantially equal to 300 mm, and the diameter D1 of the carrying surface 112 of the chuck body 110 is substantially greater than 130 mm, such as being substantially equal to or smaller than 260 mm. In the present embodiment, the diameter D1 of the carrying surface 112 is substantially 260 mm. In some embodiments, the width W1 of the seal ring 120 is from about 6 mm to about 10 mm, and a diameter of the vacuum hole 114 is about 13 mm to 16 mm. For example, the diameter of the vacuum hole 114 may be about 14.7 mm.

With such configuration, by increasing the diameter D1 of the carrying surface 112, the contact area between the wafer 200 and the wafer chuck 100 is thereby increased. Accordingly, when the vacuum is applied by the vacuum device 130, warpage profile of the wafer 200 can be well adjusted since the vacuum force and the supporting force from the wafer chuck 100 can distribute more evenly. Thereby, coating uniformity of a coating formed on the wafer 200 can be improved. In addition, by increasing the width W1 of each of the seal rings 120 along with the diameter D2 of the carrying surface 112, the sealing effect of the seal rings 120 is thereby enhanced. Therefore, the wafer chuck 100 is capable of handling the wafer 200 having larger size and with more significant warpage. Moreover, by increasing the diameter D1 of the carrying surface 112 while not extending beyond the peripheral edge R1, not only the coating uniformity of the coating formed on the wafer 200 can be improved, but also the chemicals exposure of the wafer chuck 100 can be prevented.

Figure 3:
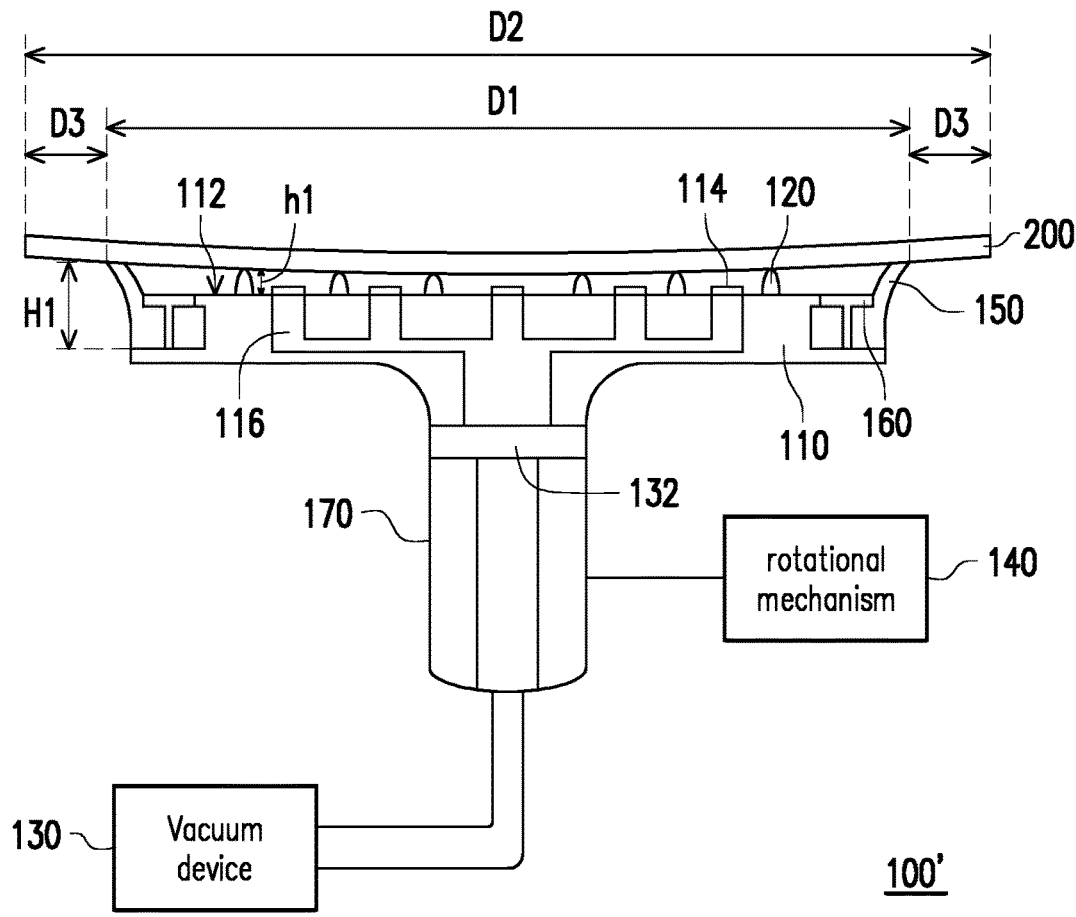
FIG. 3 illustrates a cross sectional view of a wafer chuck according to some exemplary embodiments of the present disclosure.

FIG. 3 illustrates a cross sectional view of a wafer chuck according to some exemplary embodiments of the present disclosure. It is noted that the wafer chuck 100' shown in FIG. 3 contains many features same as or similar to the wafer chuck 100 disclosed earlier with FIG. 1 and FIG. 2. For purpose of clarity and simplicity, detail description of same or similar features may be omitted, and the same or similar reference numbers denote the same or like components. The main differences between the wafer chuck 100' shown in FIG. 3 and the wafer chuck 100 are described as follows.

Referring to FIG. 3, the wafer chuck 100' can include a number of vacuum holes 114 in some embodiments. In some embodiments, the vacuum holes 114 are connected to the vacuum device 130 by way of a plurality of vacuum lines or passages 116, running along an axis of the shaft 170 and converging at, for example, the center of the shaft 170. It is noted that the vacuum formed by any given vacuum hole (e.g., vacuum holes 114) is not uniform over the space between the chuck body 110 and the wafer 200, but instead is lowest within an area in close proximity to the given vacuum hole and increases as a function of the distance from the given vacuum hole.

Accordingly, in the present embodiment, the use of multiple vacuum holes 114, distributed at different locations on the chuck body 110, reduces the presence of localized low pressure regions between the chuck body 110 and the wafer 200 since it share the pressure at which each vacuum hole 114 can operate to achieve an uniform vacuum pressure. In other words, a uniform vacuum pressure can be achieved between the chuck body 110 and the wafer 200 by operating a larger number of vacuum holes 114. Therefore, the use of multiple vacuum holes 114 can form a low pressure vacuum between the chuck body 110 and the wafer 200, without forming localized low pressure regions that would otherwise result from the high vacuum required to affix a such large wafer 200 to the chuck body 110. It is appreciated that the vacuum generated by each of the vacuum holes 114 could vary depending on the maximum spinning speed of the wafer 200 in a given spin coating recipe.

It is appreciated that the shape of the vacuum holes 114 can vary in different embodiments without substantially reducing the uniformity of the vacuum formed between the chuck body 110 and the wafer 200. For example, in the present embodiment, the vacuum holes 114 include circular shaped vacuum holes. In other embodiments, the vacuum holes 114 may include triangular, square, and/or polygon shaped vacuum holes. In some embodiments, the shape of one of the vacuum holes 114 may be different from that of another one of the vacuum holes 114.

Figure 4:
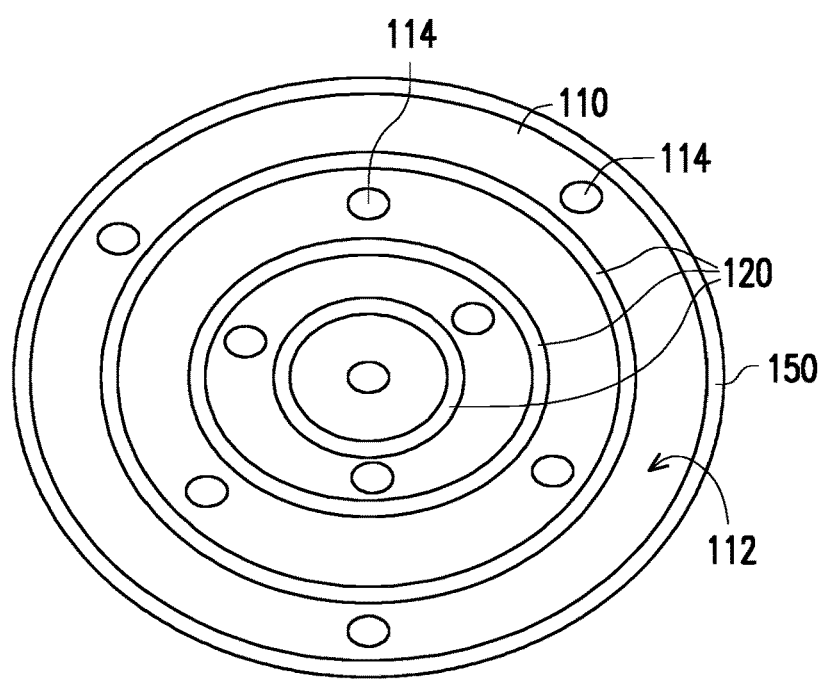
FIG. 4 to FIG. 13 illustrate top views of wafer chucks according to some exemplary embodiments of the present disclosure.
Figure 5:
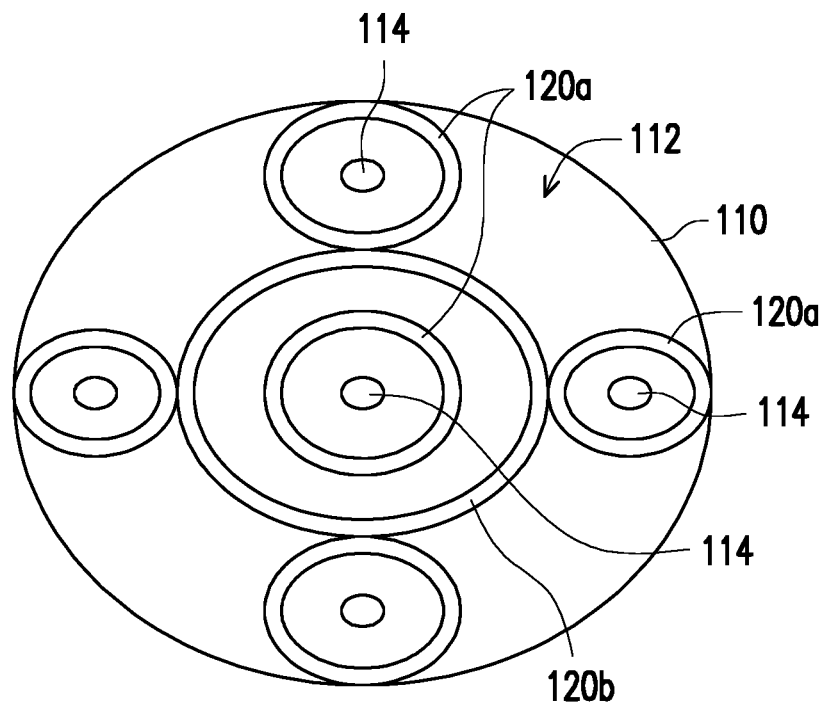
Figure 6:
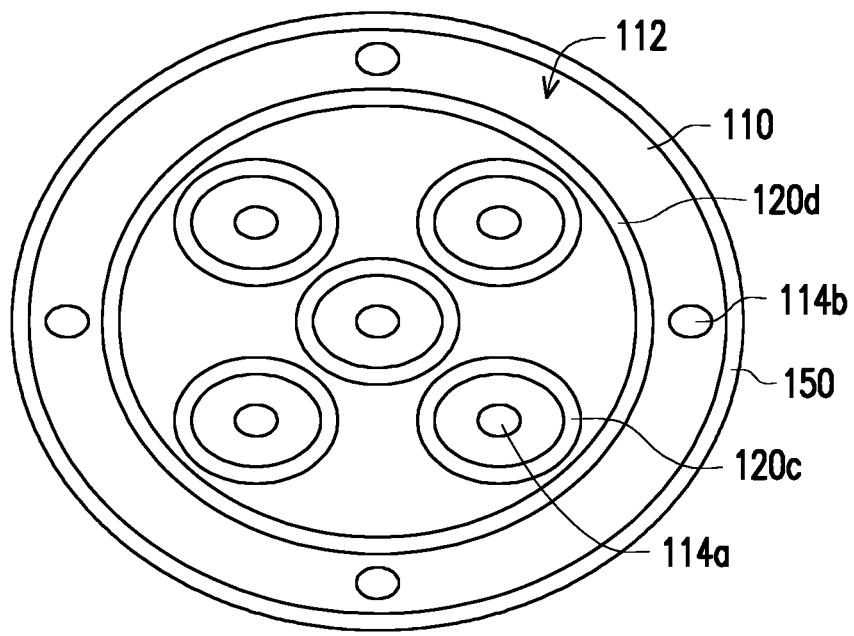

FIG. 4 to FIG. 6 illustrate top views of wafer chucks according to some exemplary embodiments of the present disclosure. It is noted that there are a plurality of different embodiments in terms of the arrangements of the vacuum holes 114 and the seal rings 120 on the carrying surface 112. The top views of the wafer chucks shown in FIG. 4 to FIG. 6 are merely for illustration. The embodiments of the arrangement are not limited thereto. The wafer chucks shown in FIG. 4 to FIG. 6 contains many features same as or similar to the wafer chucks disclosed earlier with FIG. 1 to FIG. 3. For purpose of clarity and simplicity, detail description of same or similar features may be omitted, and the same or similar reference numbers denote the same or like components. The main differences are described as follows.

Referring to FIG. 4, in some embodiments, the seal rings 120 are arranged in a concentric manner. Accordingly, the diameters of the seal rings 120 gradually increase from the center to the edge of the chuck body 110. In some embodiments, the wafer chuck 100 further includes an edge ring 150. The edge ring 150 surrounds an edge of the chuck body 110. As such, the vacuum holes 114 are distributed somewhat evenly between any two adjacent seal rings 120, and/or between the seal ring 120 and the edge ring adjacent to each other.

In some embodiments, each of the seal rings 120 surrounding at least one of the vacuum holes 114. For example, referring to FIG. 5, each of the seal rings 120a surrounds each of the vacuum holes 114, and the seal ring 120b is arranged in a concentric manner with the seal ring 120a, which surrounds the vacuum hole 114 at the center of the carrying surface 112. In one embodiment, the diameter of the seal ring 120b is substantially greater than the diameter of each of the seal rings 120a.

Referring to FIG. 6, in some embodiments, the seal ring 120d surrounds a central region of the chuck body 110 to define the central region and a peripheral region of the chuck body 110. As such, some of the vacuum holes 114a are disposed within the central region of the chuck body 110 and other vacuum holes 114b are disposed within the peripheral region of the chuck body 110. In some embodiments, the wafer chuck 100 further includes an edge ring 150. The edge ring 150 surrounds an edge of the chuck body 110. As such, the vacuum holes 114a may be sealed by the seal ring 120 and the vacuum holes 114b may be sealed by the seal ring 120d and the edge ring 150 adjacent to each other. In one of the implementations, the vacuum holes 114a disposed within the central region of the chuck body 110 are surrounded by the seal rings 120c respectively, while the vacuum holes 114b are distributed evenly within the peripheral region without surrounded by the seal rings 120c respectively.

Figure 7:
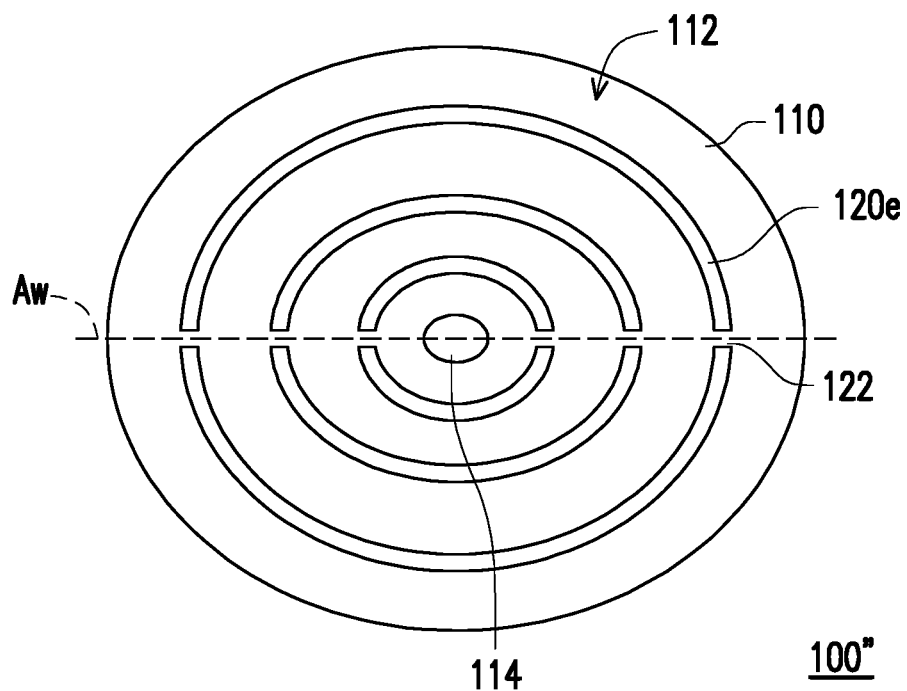

FIG. 7 illustrates a top view of a wafer chuck according to some exemplary embodiment of the present disclosure. It is noted that the wafer chuck 100" shown in FIG. 7 contains many features same as or similar to the wafer chuck 100 disclosed earlier with FIG. 1 and FIG. 2. For purpose of clarity and simplicity, detail description of same or similar features may be omitted, and the same or similar reference numbers denote the same or like components. The main differences between the wafer chuck 100" shown in FIG. 7 and the wafer chuck 100 are described as follows.

Referring to FIG. 7, in some embodiments, the plurality of seal rings 120 (120e) include a plurality of opening gaps 122. In some embodiments, at least one of the seal rings 120 (120e) includes at least one of the opening gap 122. In the present embodiment, each of the seal rings 120 (120e) includes two opening gaps 122, but the disclosure is not limited thereto. The opening gaps 122 are aligned with one another to define at least one airway Aw between the seal rings 120. In other words, the seal rings 120 are in gas communication with one another through the opening gaps 122. In some embodiments, the opening gaps 122 are in direct communication with the vacuum hole 114. For example, the vacuum hole 114 is disposed at the center of the carrying surface 122 of chuck body 110, so the opening gaps 122 are aligned with one another along a direction passing through the center of the carrying surface 122 of chuck body 110, and is in direct communication with the vacuum hole 114. Therefore, the vacuum hole 114 contributes to formation of a vacuum within the airway Aw defined by the opening gaps 122, and the vacuum condition is extended through the seal rings 120e via the airway Aw. In other words, the vacuum can be extended to the entire carrying surface 112 of the chuck body 110 and further hold the wafer 200 in place more securely.

FIG. 8 to FIG. 11 illustrate top views of wafer chucks according to some exemplary embodiments of the present disclosure. It is noted that there are a plurality of different embodiments in terms of the arrangements of the opening gaps on the carrying surface 112. The top views of the wafer chucks shown in FIG. 8 to FIG. 11 are merely for illustration. The embodiments of the arrangement are not limited thereto. The wafer chucks shown in FIG. 8 to FIG. 11 contains many features same as or similar to the wafer chucks disclosed earlier with FIG. 1 to FIG. 3. For purpose of clarity and simplicity, detail description of same or similar features may be omitted, and the same or similar reference numbers denote the same or like components. The main differences are described as follows.

Figure 8:
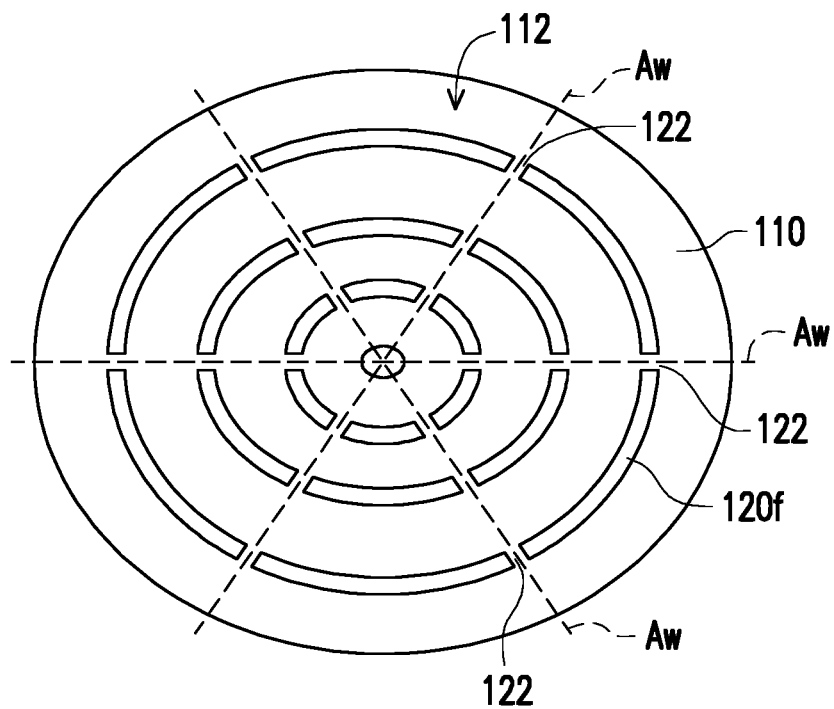

Referring to FIG. 8, in some embodiments, the opening gaps 122 may define a plurality of airways Aw, and the airways Aw are arranged in a radial manner centered around the vacuum hole (e.g. the vacuum hole 114 shown in FIG. 7). In one of the implementations, the vacuum hole 114 is disposed at the center of the chuck body 110, the seal rings 120f are arranged in a concentric manner, and the opening gaps 122 are aligned with one another along a plurality of directions emanating from the vacuum hole 114 and passing through the seal rings 120f to form a plurality of airways Aw as it is shown in FIG. 8. In some embodiments, the airways Aw emanating from the vacuum hole 114 may further be in gas communication with a series of other airways Aw provided on the carrying surface 112 of the chuck body 110 to further extend the vacuum application throughout the carrying surface 112.

Figure 9:
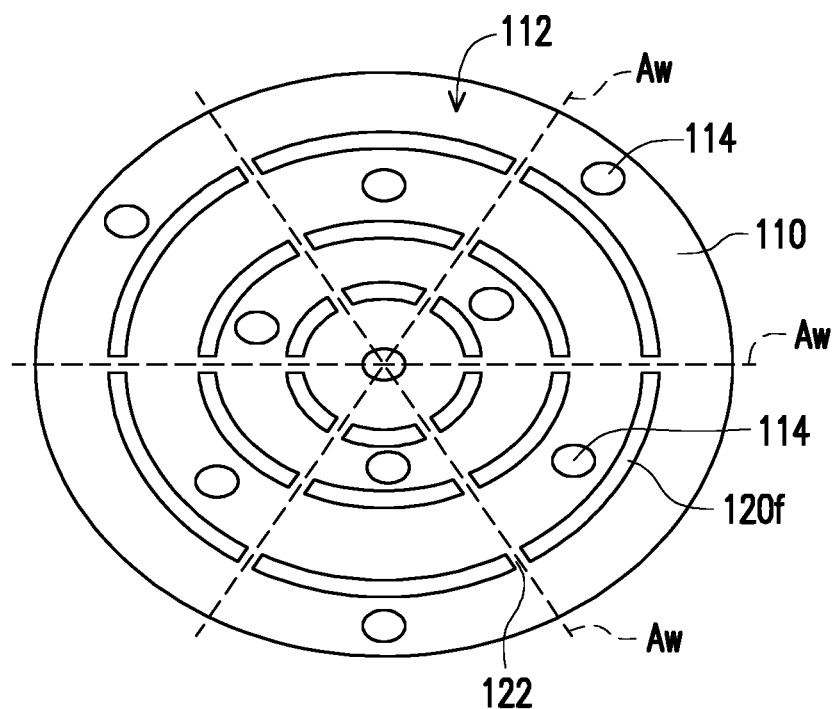

Referring to FIG. 9, in some embodiments, the carrying surface 112 can include a plurality of the airways Aw and a plurality of the vacuum hole 114. One of the vacuum holes 114 is disposed at the center of the carrying surface 112, and the rest of the vacuum holes 114 may distributed evenly on the carrying surface 112, but the disclosure does not so limit the arrangement of the vacuum holes 114. In one of the implementations, the seal rings 120f are arranged in a concentric manner, and the airways Aw are arranged in a radial manner. In other words, the opening gaps 122 are aligned with one another along a plurality of directions emanating from the vacuum hole 114 at the center of the carrying surface 112 and passing through the seal rings 120f to form a plurality of airways Aw as shown in FIG. 9. In some embodiments, the airways Aw divide the carrying surface 112 into a plurality of sectors and the vacuum holes 114 may be distributed evenly on each of the sectors. With such arrangement, the vacuum provided by the vacuum device (e.g. the vacuum device 130 shown in FIG. 1 and FIG. 3) can be evenly distributed over each of the sectors of the carrying surface 112 defined by the seal rings 120f or segments thereof. In some embodiments, the airways Aw emanating from the vacuum hole 114 may further be in fluid communication with a series of other airways Aw provided on the carrying surface 112 of the chuck body 110 to further extend the vacuum application.

Figure 10:
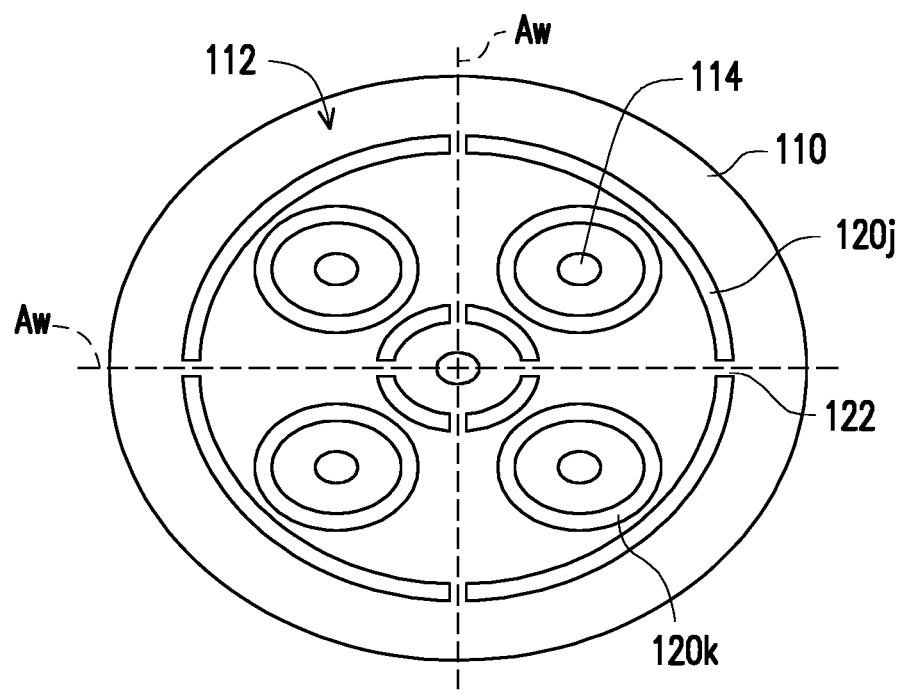

Referring to FIG. 10, in some embodiments, the carrying surface 112 can include a plurality of the airways Aw defined by the opening gaps 122 and a plurality of vacuum hole 114. One of the vacuum holes 114 is disposed at the center of the carrying surface 112, and the rest of the vacuum holes 114 may be distributed evenly on the carrying surface 112. In some embodiments, each of the seal rings 120k surrounds at least one of the vacuum holes 114. In one of the implementations, the seal rings 120k surround the vacuum holes 114 respectively, and the seal ring 120j surrounds all of the vacuum holes 114 and the seal rings 120k. In other words, the opening gaps 122 are aligned with one another along a plurality of directions emanating from the vacuum hole 114 at the center of the carrying surface 112 and passing through the seal rings 120j, 120k to form a plurality of airways Aw as it is shown in FIG. 10. With this arrangement, the vacuum provided by the vacuum device (e.g. the vacuum device 130 shown in FIG. 1 and FIG. 3) can be evenly distributed over the carrying surface 112 through the vacuum holes 114 and the airways Aw. In some embodiments, the airways Aw emanating from the vacuum hole 114 may be in fluid communication with a series of other airways Aw provided on the carrying surface 112 of the chuck body 110 to further extend the vacuum application.

Figure 11:
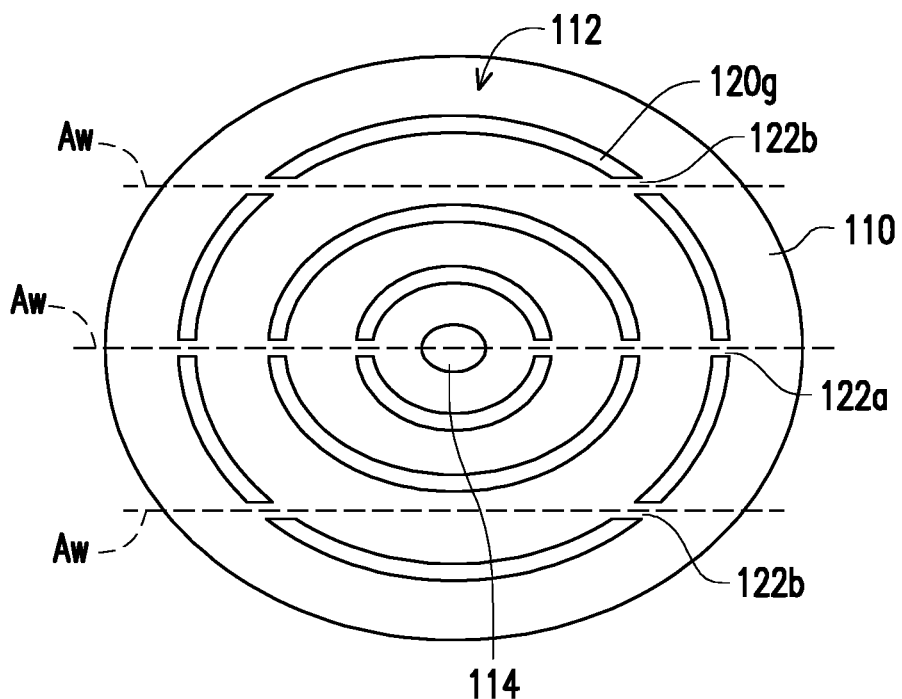

Referring to FIG. 11, each of the seal rings includes a plurality of opening gaps 122 and the opening gaps 122 including a plurality of opening gaps 122a and a plurality of opening gaps 122b, which are aligned with one another along a plurality of directions parallel to one another to define a plurality of airways Aw. In some embodiments, the opening gaps 122a are aligned with one another along a direction passing through the center of the chuck body 110. The opening gaps 122b are aligned with one another along a plurality of directions parallel to the airway Aw defined by the opening gaps 122a. In some embodiments, the vacuum hole 114 is disposed at the center of the carrying surface 112, but the present disclosure does not so limit the number and the arrangement of the vacuum hole 114. In some embodiments, the seal rings 120g are arranged in a concentric manner, and the airway Aw are arranged parallel to one another. In one of the implementations, one of the airways Aw defined by the opening gaps 122a passes through the vacuum hole 114 at the center of the carrying surface 112 and the rest of the airways Aw defined by the opening gaps 122b are symmetrically arranged and parallel to the opening gaps 122a as shown in FIG. 11. With such arrangement, the vacuum provided by the vacuum device (e.g. the vacuum device 130 shown in FIG. 1 and FIG. 3) can be evenly distributed over each of the sectors of the carrying surface 112. In some embodiments, the airways Aw parallel to one another may be in fluid communication with a series of other airways Aw provided on the carrying surface 112 of the chuck body 110 to further extend the vacuum application.

Figure 12:
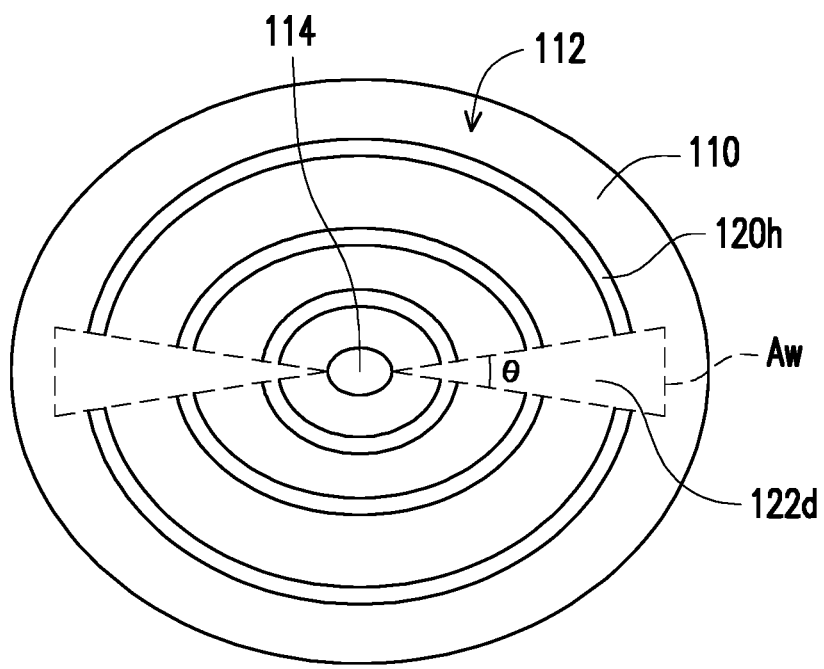
Figure 13:
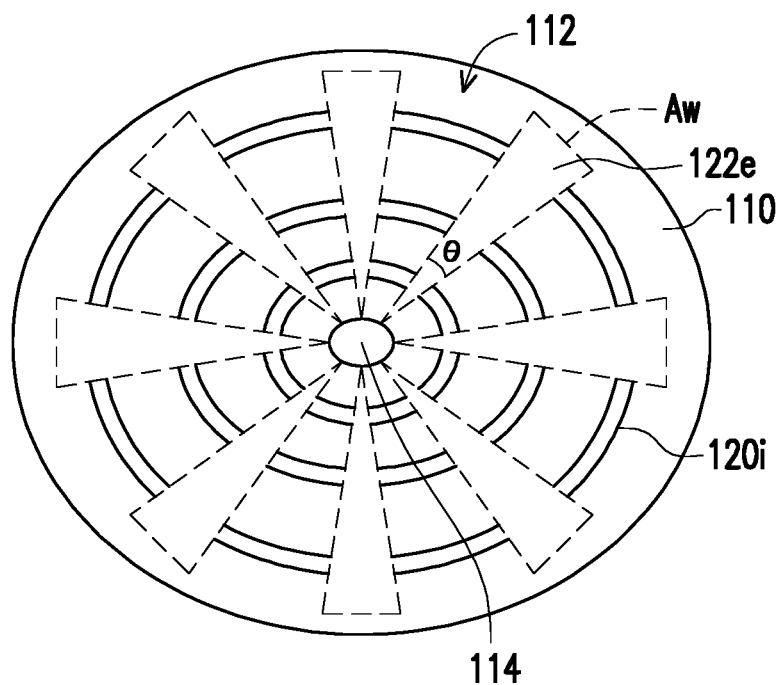

FIG. 12 to FIG. 13 illustrate top views of wafer chucks according to some exemplary embodiments of the present disclosure. It is noted that there are a plurality of different embodiments in terms of the arrangements of the opening gaps on the carrying surface. The top views of the wafer chucks shown in FIG. 12 to FIG. 13 are merely for illustration. The embodiments of the arrangement are not limited thereto. The wafer chucks shown in FIG. 12 to FIG. 13 contains many features same as or similar to the wafer chucks shown in FIG. 8 to FIG. 11. For purpose of clarity and simplicity, detailed description of same or similar features may be omitted, and the same or similar reference numbers denote the same or like components. The main differences are described as follows.

Referring to FIG. 12, in some embodiments, the airways Aw defined by the opening gaps 122d is in a shape of a sector. In other words, the widths of the opening gaps 122d in each of the seal rings 120h gradually increases from the center of the carrying surface 112 to the edge of the carrying surface 112. The vacuum hole 114 is disposed at the center of the carrying surface 112, and the widths of the opening gaps 122d in each of the seal rings 120h gradually increases from the vacuum hole 114 at the center of the carrying surface 112 to the edge of the carrying surface 112. In some embodiments, a vertex angle θ of the sector substantially ranges from 2° to 15°, but the disclosure is not limited thereto. With the sector-shaped airways Aw, the opening gaps 122d can provide better air guiding effect for the air flowing toward the vacuum hole 114 at the center of the carrying surface 112.

Referring to FIG. 13, in some embodiments, the number of the airways Aw defined by the opening gaps 122e is plural, and each of the airways Aw is in a shape of a sector. In some embodiments, the vacuum hole 114 is disposed at the center of the carrying surface 112, and the seal rings 120i are arranged in a concentric manner. In one of the implementation, the airways Aw are arranged in a radial manner and pass through each of the seal rings 120i respectively. In other words, the airways Aw emanate from the vacuum hole 114 at the center of the carrying surface 112 and passes through the seal rings 120i to form a plurality of sector-shaped airways Aw as it is shown in FIG. 13. In some embodiments, a vertex angle θ of the sector substantially ranges from 2° to 15°, but the disclosure is not limited thereto. With the sector-shaped airways Aw defined by the opening gaps 122e, the opening gaps 122e can provide better air guiding effect for the air flowing toward the vacuum hole 114 at the center of the carrying surface 112.

Figure 14:
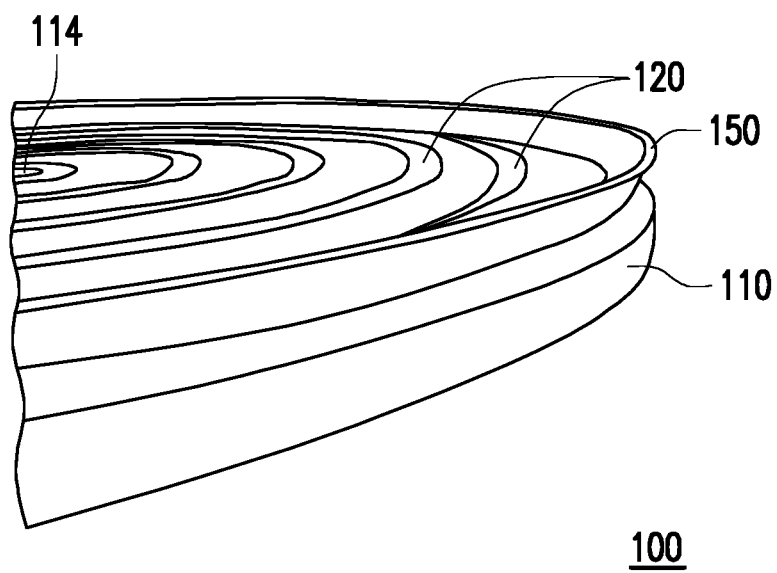
FIG. 14 illustrates a partial perspective view of a wafer chuck according to some exemplary embodiments of the present disclosure.
Figure 15:
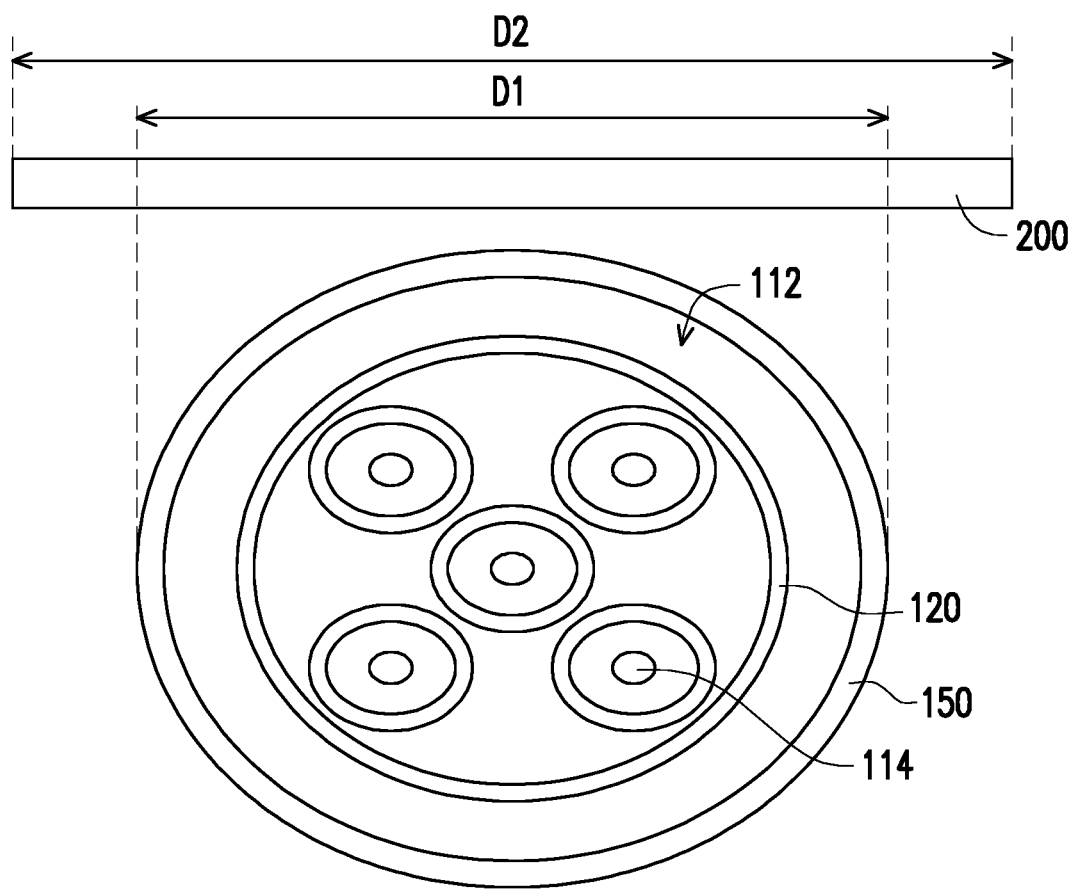
FIG. 15 illustrates a top view of a wafer chuck according to some exemplary embodiments of the present disclosure.

FIG. 14 illustrates a partial perspective view of a wafer chuck according to some exemplary embodiments of the present disclosure. FIG. 15 illustrates a top view of a wafer chuck according to some exemplary embodiments of the present disclosure. It is noted that the wafer chucks shown in FIG. 14 and FIG. 15 contain many features same as or similar to the wafer chuck disclosed earlier with FIG. 4 to FIG. 13. For purpose of clarity and simplicity, detail description of same or similar features may be omitted, and the same or similar reference numbers denote the same or like components. The main differences are described as follows.

Referring to FIG. 1 and FIG. 14, in some embodiments, the wafer chuck 100 further includes an edge ring 150. The edge ring 150 surrounds an edge of the chuck body 110. A side profile of the edge ring 150 may be in an L shape. A top surface of the edge ring 150 is substantially higher than a top surface of each of the seal rings 120. In some embodiments, the height H1 of the edge ring 150 is greater than the height h1 of the seal rings 120. Accordingly, the edge ring 150 can be functioned as a lip seal for the wafer chuck 100. In such embodiments, the edge ring 150 may firstly contact a peripheral of the warped wafer 200 to form an initial sealing state between the warped wafer 200 and the wafer chuck 100. As the vacuum applies under the initial sealing state, the peripheral of the warped wafer 200 is pulled toward the wafer chuck 100, so the warpage of the wafer 200 can be reduced, and the edge ring 150 may be deformed accordingly. In other embodiments, the height H1 of the edge ring 150 may be substantially equal to the height h1 of the seal rings 120. In one of the implementations, the vacuum hole 114 is disposed at a center of the chuck body 110, the seal rings 120 are arranged in a concentric manner, and the edge ring 150 surrounds the edge of the chuck body 110 and all of the seal rings 120. In detail, referring to FIG. 1, a cross section of the edge ring 150 is in an L shape. For example, the edge ring 150 includes a positioning portion 152 and an abutting portion 154 connected to each other. The positioning portion 152 is embedded in the chuck body 110, and the abutting portion 154 is protruded from the carrying surface 112.

In some embodiments, a top surface of the abutting portion 154 is substantially higher than the top surface of each of the seal rings 120. In addition, the top surface of each of the seal rings 120 is substantially higher than a top surface of the vacuum hole 114. Accordingly, when the wafer 200 is disposed on the wafer chuck 100 and the vacuum is applied, the back surface of the wafer 200 would lean against the top surfaces of the seal rings 120 and the edge ring 150. In some embodiments, the wafer chuck 100 further includes a plurality of fastening components 160 penetrating the chuck body 110 and the positioning portion 152 to lock the positioning portion 152 to the chuck body 110. For example, the fastening components 160 may be a screw or other suitable fastening means. In some embodiments, the abutting portion 154 has a curvy profile as shown in FIG. 14. With such configuration, when the wafer 200 is disposed on the wafer chuck 100 and the vacuum is applied, the edge ring 150 higher than the seal rings 120 leans against a peripheral edge of the wafer 200, so as to further enhance the vacuum condition between the wafer 200 and the wafer chuck 100. Therefore, the wafer chuck 100 is capable of handling the wafer 200 having larger size and prone to experience more significant warpage. Accordingly, coating uniformity of a coating formed on the larger sized wafer 200 by the wafer chuck 100 can be improved.

Referring to FIG. 3 and FIG. 15, in some embodiments, the wafer chuck 100' further includes an edge ring 150, and the number of the vacuum hole 114 is plural. The edge ring 150 surrounds an edge of the chuck body 110. In some embodiments, a top surface of the edge ring 150 is substantially higher than a top surface of each of the seal rings 120. In some embodiments, the height H1 of the edge ring 150 is greater than the height h1 of the seal rings 120. In one of the implementations, the vacuum holes 114 are distributed somewhat evenly on the carrying surface 112 of the chuck body, each of the seal rings 120 surrounds at least one of the vacuum holes 114, and the edge ring 150 surrounds the edge of the chuck body 110 and all of the seal rings 120. In detail, referring to FIG. 3, a cross section of the edge ring 150 is in an L shape. For example, the edge ring 150 includes a positioning portion 152 and an abutting portion 154 connected to each other. The positioning portion 152 is embedded in the chuck body 110, and the abutting portion 154 is protruded from the carrying surface 112.

In some embodiments, a top surface of the abutting portion 154 is substantially higher than the top surface of each of the seal rings 120. In addition, the top surface of each of the seal rings 120 is substantially higher than a top surface of the vacuum hole 114. Accordingly, when the wafer 200 is disposed on the wafer chuck 100 and the vacuum is applied, the back surface of the wafer 200 would lean against the top surfaces of the seal rings 120 and the edge ring 150. In some embodiments, the wafer chuck 100' further includes a plurality of fastening components or fastener 160 penetrating the chuck body 110 and the positioning portion 152 to lock the positioning portion 152 to the chuck body 110. For example, the fastening components 160 may be a screw or other suitable fastening means. With such configuration, when the warped wafer 200 is disposed on the wafer chuck 100', the edge ring 150 higher than the seal rings 120 leans against a peripheral edge of the wafer 200, so as to further enhance the vacuum condition between the warped wafer 200 and the wafer chuck 100' since the edge ring 150 can contact the peripheral of the warped wafer 200 to form an initial sealing state. Therefore, the wafer chuck 100' is capable of handling the wafer 200 having larger size (e.g. the diameter D1 of the carrying surface 112 is substantially greater than 130 mm and substantially equal to or smaller than 260 mm) and prone to more significant warpage. In some embodiments, a ratio of a diameter D1 of the carrying surface 112 to a diameter D2 of the wafer 200 is substantially equal to greater than 45% and substantially equal to or smaller than 90%. Accordingly, the wafer chuck 100' can provide sufficient support and vacuum force to the larger sized wafer 200, so coating uniformity of a coating formed on the larger sized wafer 200 by the wafer chuck 100' can be improved.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a wafer chuck includes a chuck body, and a plurality of seal rings. The chuck body includes a carrying surface configured to receive a wafer and at least one vacuum hole disposed on the carrying surface. A ratio of a diameter of the carrying surface to a diameter of the wafer is substantially equal to greater than 45% and substantially equal to or smaller than 90%. The seal rings are disposed on the carrying surface and configured to physically contact with the wafer. The seal rings surround the vacuum hole.

In accordance with some embodiments of the disclosure, a wafer chuck includes a chuck body, and a plurality of seal rings. The chuck body includes a carrying surface configured to receive a wafer and at least one vacuum hole disposed on the carrying surface. The seal rings are disposed on the carrying surface and configured to physically contact with the wafer. The seal rings surround the vacuum hole. The plurality of seal rings comprise a plurality of opening gaps, and the opening gaps are aligned with one another to define at least one airway between the seal rings.

In accordance with some embodiments of the disclosure, a wafer chuck includes a chuck body, a plurality of seal rings, an edge ring, and a vacuum device. The chuck body includes a carrying surface configured to receive a wafer and a vacuum hole disposed on the carrying surface. The seal rings are disposed on the carrying surface and configured to physically contact with the wafer. The seal rings surround the vacuum hole. The edge ring surrounds an edge of the chuck body. A top surface of the edge ring is substantially higher than a top surface of each of the seal rings. The vacuum device is coupled to the chuck body and in gas communication with the vacuum holes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer chuck, comprising:
   a chuck body comprising a carrying surface configured to receive a wafer and at least one vacuum hole disposed on the carrying surface;
   a plurality of seal rings disposed on the carrying surface and configured to physically contact with the wafer, wherein the seal rings surrounding the at least one vacuum hole, the plurality of seal rings comprise a plurality of opening gaps, and the opening gaps are aligned with one another to define at least one airway between the seal rings;
   an edge ring surrounding an edge of the chuck body, wherein a top surface of the edge ring, which is configured to physically contact with a back surface of the wafer, is substantially higher than a top surface of each of the seal rings.

2. The wafer chuck as claimed in claim 1, wherein the opening gaps are aligned with one another along a direction passing through a center of the chuck body, and the at least one vacuum hole is disposed at the center of the carrying surface.

3. The wafer chuck as claimed in claim 1, wherein a side profile of the edge ring is in an L shape functioned as a lip seal for the wafer chuck, wherein the edge ring is configured to contact a peripheral of the wafer to form an initial sealing state between the wafer and the wafer chuck.

4. The wafer chuck as claimed in claim 1, wherein the at least one vacuum hole comprises a plurality of vacuum holes, one of the plurality of vacuum holes is disposed at the center of the carrying surface, and each of the seal rings surrounds at least one of the plurality of vacuum holes.

5. The wafer chuck as claimed in claim 1, wherein the at least one airway comprises a plurality of airways, and the plurality of airways are arranged in a radial manner.

6. The wafer chuck as claimed in claim 1, wherein the at least one airway comprises a plurality of airways, and the plurality of airways are parallel to one another.

7. The wafer chuck as claimed in claim 1, wherein a shape of the airways is in a shape of a sector, and a vertex angle of the sector substantially ranges from 2° to 15°.

8. The wafer chuck as claimed in claim 1, wherein a ratio of a diameter of the carrying surface to a diameter of the wafer is substantially equal to or greater than 45% and substantially equal to or smaller than 90%.

9. The wafer chuck as claimed in claim 1, wherein the edge ring comprises a positioning portion embedded in the chuck body.

10. The wafer chuck as claimed in claim 9, wherein the edge ring further comprises an abutting portion connected to the positioning portion and protruded from the carrying surface.

11. The wafer chuck as claimed in claim 9, further comprising a fastening component penetrating through the positioning portion and extending into the chuck body to lock the positioning portion to the chuck body.

12. A wafer chuck, comprising:
    a chuck body comprising a carrying surface configured to receive a wafer and a vacuum hole disposed on the carrying surface;
    a plurality of seal rings disposed on the carrying surface and configured to physically contact with the wafer, wherein the seal rings surrounding the vacuum hole;
    an edge ring surrounding an edge of the chuck body, wherein a top surface of the edge ring, which is configured to physically contact with a back surface of the wafer, is substantially higher than a top surface of each of the seal rings; and
    a vacuum device coupled to the chuck body and in gas communication with the vacuum holes.

13. The wafer chuck as claimed in claim 12, wherein a ratio of a diameter of the carrying surface to a diameter of the wafer is substantially equal to or greater than 45% and substantially equal to or smaller than 90%.

14. The wafer chuck as claimed in claim 12, wherein the edge ring comprises a positioning portion embedded in the chuck body and an abutting portion protruding from the carrying surface, and a top surface of the abutting portion is substantially higher than the top surface of each of the seal rings.

15. The wafer chuck as claimed in claim 14, further comprising a fastening component penetrating the chuck body and the positioning portion to lock the positioning portion to the chuck body.

16. The wafer chuck as claimed in claim 12, wherein a top surface of each of the seal rings is substantially higher than the top surface of the vacuum hole.

17. A wafer chuck, comprising:
    a chuck body configured to receive a wafer and at least one vacuum hole disposed on the chuck body;
    a plurality of seal rings disposed on the chuck body and protruded from a carrying surface of the chuck body, wherein the plurality of seal rings are configured to physically contact with the wafer; and
    an edge ring surrounding an edge of the chuck body, wherein a top surface of the edge ring, which is configured to physically contact with a back surface of the wafer, is substantially higher than a top surface of each of the seal rings.

18. The wafer chuck as claimed in claim 17, wherein the plurality of seal rings comprise a plurality of opening gaps, and the opening gaps are aligned with one another to define at least one airway between the seal rings.

19. The wafer chuck as claimed in claim 17, wherein the edge ring comprises a positioning portion embedded in the chuck body.

20. The wafer chuck as claimed in claim 19, wherein the edge ring further comprises an abutting portion connected to the positioning portion and protruded from the chuck body.

* * * * *